(12) United States Patent
Spann (10) Patent No.: US 10,276,472 B2
(45) Date of Patent: Apr. 30, 2019

(54) HEAT TRANSFER PLATE HAVING SMALL CAVITIES FOR TAKING UP A THERMAL TRANSFER MATERIAL

(71) Applicant: IXYS, LLC, Milpitas, CA (US)

(72) Inventor: Thomas Spann, Furth (DE)

(73) Assignee: IXYS, LLC, Milpitas, CA (US)

( * ) Notice: Subject to any disclaimer, the term of this patent is extended or adjusted under 35 U.S.C. 154(b) by 0 days.

(21) Appl. No.: 15/476,976

(22) Filed: Apr. 1, 2017

(65) Prior Publication Data

US 2018/0286778 A1 Oct. 4, 2018

(51) Int. Cl.
| | | |
|---|---|---|
| H01L 23/367 | (2006.01) | |
| H01L 23/495 | (2006.01) | |
| H01L 21/48 | (2006.01) | |
| H01L 23/34 | (2006.01) | |
| H01L 23/32 | (2006.01) | |
| H01L 23/38 | (2006.01) | |
| H01L 23/36 | (2006.01) | |
| H01L 23/373 | (2006.01) | |
| H01L 25/07 | (2006.01) | |
| H01L 23/40 | (2006.01) | |

(52) U.S. Cl.
CPC ............ *H01L 23/32* (2013.01); *H01L 23/36* (2013.01); *H01L 23/3735* (2013.01); *H01L 25/07* (2013.01); *H01L 23/4006* (2013.01); *H01L 2023/405* (2013.01); *H01L 2023/4068* (2013.01)

(58) Field of Classification Search
CPC ......... H01L 23/32; H01L 23/34; H01L 23/38; H01L 23/3675; H01L 23/49568; H01L 21/4871; H01L 2023/405; H01L 2023/4068
See application file for complete search history.

(56) References Cited

U.S. PATENT DOCUMENTS

| | | | | |
|---|---|---|---|---|
| 5,328,751 | A * | 7/1994 | Komorita | H01L 23/49861 257/E23.066 |
| 7,923,833 | B2 * | 4/2011 | Furukawa | H01L 23/3735 257/705 |
| 8,455,987 | B1 * | 6/2013 | Spann | H01L 21/56 257/675 |
| 2004/0131832 | A1 * | 7/2004 | Tsukaguchi | H01L 23/3735 428/210 |
| 2010/0068552 | A1 * | 3/2010 | Goerlich | C22C 13/00 428/615 |
| 2011/0053319 | A1 * | 3/2011 | Hohlfeld | H01L 23/24 438/121 |

(Continued)

*Primary Examiner* — Peniel M Gumedzoe

(57) ABSTRACT

A power semiconductor device module includes, among other parts, a DMB structure. The DMB structure includes a ceramic sheet, a top metal plate that is directly bonded to the top of the ceramic, and a bottom metal plate that is directly bonded to the bottom of the ceramic. A power semiconductor device die is attached to the top metal plate. The bottom surface of the bottom metal plate has a plurality small cavities. When the bottom metal plate is attached to another metal member, a material between the plate and the member (for example, thermal grease or a PCM or solder) is forced into the cavities. This results in an improvement in thermal transfer between the plate and the member. Such cavities can alternatively, or in addition, be included on a metal surface other than a DMB, such as the bottom surface of a baseplate of the module.

6 Claims, 9 Drawing Sheets

EXPLODED VIEW OF THE SEMICONDUCTOR DEVICE MODULE

VIEW OF THE BOTTOM OF THE BASEPLATE (FIFTH EMBODIMENT)

(56) References Cited

U.S. PATENT DOCUMENTS

| | | | |
|---|---|---|---|
| 2014/0153238 A1* | 6/2014 | Nishimura | H01L 25/0753 362/237 |
| 2015/0085446 A1* | 3/2015 | Hable | H01L 23/31 361/719 |
| 2016/0133533 A1* | 5/2016 | Lin | H01L 24/83 257/766 |

* cited by examiner

SEMICONDUCTOR DEVICE MODULE

FIG. 1

SEMICONDUCTOR DEVICE MODULE

FIG. 2

EXPLODED VIEW OF THE SEMICONDUCTOR DEVICE MODULE

FIG. 3A

EXPLODED SECTIONAL VIEW OF THE
SEMICONDUCTOR DEVICE MODULE

FIG. 3B

CROSS-SECTIONAL SIDE VIEW OF THE
DMB/SEMICONDUCTOR DEVICE ASSEMBLY

FIG. 4

BOTTOM OF THE SEMICONDUCTOR DEVICE MODULE

FIG. 5

DMB WITHIN THE SEMICONDUCTOR DEVICE MODULE

FIG. 6

VIEW OF THE BOTTOM PLATE OF THE DMB

FIG. 7

VIEW OF THE BOTTOM PLATE OF THE DMB WITH DIMENSIONS MARKED

FIG. 8

VIEW OF THE "DETAIL AREA" OF THE BOTTOM PLATE
OF THE DMB (SHOWING TWO CAVITIES)

FIG. 9

CROSS-SECTIONAL SIDE VIEW OF THE "DETAIL AREA" OF THE BOTTOM
PLATE OF THE DMB (SHOWING TWO CAVITIES IN CROSS-SECTION)

FIG. 10

| | | |
|---|---|---|
| A | WIDTH OF AREA AxA, LENGTH OF AREA AxA | 10.0 mm |
| B | NUMBER OF CAVITIES IN THE AREA AxA | AT LEAST 10 |
| C | THE MINIMUM INSIDE WIDTH DIMENSION OF A CAVITY (AT THE BOTTOM SURFACE OF THE METAL PLATE] | ≤ 1.0 mm |
| D | THE DEPTH OF A CAVITY | < 0.5 mm |
| E | BOTTOM OF RANGE OF AGGREGATE CAVITY VOLUME | 0.001 mm$^3$ |
| F | TOP OF RANGE OF AGGREGATE CAVITY VOLUME | 10.0 mm$^3$ |

FIG. 11

VIEW OF THE "DETAIL AREA" OF THE BOTTOM PLATE
OF THE DMB (THIRD EMBODIMENT)

FIG. 12

CROSS-SECTIONAL SIDE VIEW OF THE "DETAIL AREA" OF THE BOTTOM
PLATE OF THE DMB (THIRD EMBODIMENT)

FIG. 13

VIEW OF THE BOTTOM PLATE OF THE DMB
(FOURTH EMBODIMENT)

FIG. 14

VIEW OF THE BOTTOM OF THE BASEPLATE (FIFTH EMBODIMENT)

FIG. 15

HEAT TRANSFER PLATE HAVING SMALL CAVITIES FOR TAKING UP A THERMAL TRANSFER MATERIAL

TECHNICAL FIELD

The described embodiments relate to the joining a metal member to another metal member so that there is good thermal transfer between the two members, and more particularly relate to DMB structures in power semiconductor device modules.

BACKGROUND INFORMATION

A power semiconductor device module includes an injection molded plastic housing. Within the housing is a DMB (Direct Metal Bonded)/semiconductor device assembly. The DMB/semiconductor device assembly includes a DMB structure. The DMB structure can either be a so-called DCB (Direct Copper Bonded) substrate or a so-called DAB (Direct Aluminum Bonded) substrate. In either case, the DMB structure is a multi-layer structure that includes an insulative but heat conductive center ceramic substrate layer. A planar bottom direct metal bonded metal layer is bonded to the bottom surface of the ceramic layer, and a planar top direct metal bonded metal layer is bonded to the top surface of the ceramic layer. In the case of the DMB being a DCB, these top and bottom metal layers are copper or a multi-layer structure involving copper. In the case of the DMB being a DAB, these top and bottom metal layers are aluminum or a multi-layer metal structure involving aluminum. The top metal layer is typically patterned into a plurality of islands of metal. Discrete semiconductor device dice and possibly other electronic parts are then surface mounted to the various islands on the top of the DMB structure. The various discrete semiconductor device dice and various portions of the DMB structure are then typically interconnected by bonding wires, both to each other, as well as to external connection terminals of the module, such that the overall wire bonded assembly is a desired power device circuit.

In one type of module, the bottom metal layer of the DMB forms a part of the outside surface of the module. This bottom metal layer of the DMB is supposed to be coupled to a heatsink. There is generally thermal grease or a phase change material disposed between the bottom of the DMB and the heatsink. Heat generated by the semiconductor device dice and other components within the module passes from the DMB, in some measure through the thermal grease or phase change material, and to the heatsink. An example of this type of module is the Y2-DCB module type available from IXYS Corporation, 1590 Buckeye Drive, Milpitas, Calif.

In a second type of module, the module includes a metal baseplate. The bottom metal layer of the DMB is mounted to the top of the metal baseplate. The bottom of the DMB does not form an outside surface of the module, but rather the bottom of the metal baseplate forms the outside surface of the module. The module is then mounted to a heatsink by placing an amount of thermal grease or a phase change material between the bottom of the metal baseplate and the heatsink. The module is pressed down onto the heatsink and is held in place by screws or bolts. Within the module, the DMB is either soldered to the top of the metal baseplate, or is pressed against the top of the metal baseplate with thermal grease or a phase change material disposed between the DMB and the metal baseplate. Heat generated by the semiconductor device dice and other components within the module passes down through the DMB, through the metal baseplate, and in some measure through the thermal grease or phase change material, and to the heatsink. An example of this type of module is the Y1-Cu baseplate module type available from IXYS Corporation, 1590 Buckeye Drive, Milpitas, Calif.

SUMMARY

A power semiconductor device module includes, among other parts, a DMB (Direct Metal Bonded) structure. The DMB structure includes an insulative ceramic sheet member, a top metal plate that is directly bonded to a top surface of the insulative ceramic sheet member, and a bottom metal plate that is directly bonded to a bottom surface of the insulative ceramic sheet member. A power semiconductor device die is attached to the top metal plate. The bottom surface of the bottom metal plate has a plurality of small cavities. In one example, these cavities form a two-dimensional array of cavities. An "A by A square area" of the bottom metal plate includes at least a part of each of B of the cavities. Each of the B cavities of the A by A square area has a minimum inside width dimension that is not more than C millimeters across. Each of the B cavities has a depth that is less than D millimeters. The A by A square area of the bottom metal plate has an aggregate cavity volume of between E cubic millimeters and F cubic millimeters. In one example, A is 10.0 mm (ten millimeters); B is ten; C is 1.0 mm; D is 0.5 mm; E is 0.001 mm$^3$ (0.001 cubic millimeters); and F is 10.0 mm$^3$.

In a first case, the module includes a metal baseplate. The DMB structure and the metal baseplate are pressed together and are held together under force, with an amount of either thermal grease or a phase change material between. Due to the cavities, some of the thermal grease or phase change material is forced up into the cavities. This improves the thermal transfer between the DMB structure and the metal baseplate. Alternatively, rather than there being thermal grease or a phase change material between the DMB structure and the metal baseplate, the bottom metal plate of the DMB structure may be directly soldered to the top surface of the metal baseplate. In this case, an amount of solder that is liquid may be forced up into the cavities during the soldering process.

In a second case, the module has no metal baseplate. Rather, the bottom surface of the bottom metal plate of the DMB structure is an outside surface of the module. The module may be attached to a planar metal surface of a heatsink by pressing the bottom surface of the bottom metal plate of the DMB structure against the planar metal surface of the heatsink, with an amount of thermal grease or a phase change material between. Alternatively, the bottom metal plate of the DMB structure can be soldered directly to the heatsink.

In third case, the module has a metal baseplate but it is the bottom surface of the metal baseplate that has the array of cavities. When the module is mounted to a heatsink, the bottom surface of the metal baseplate is pressed against a planar metal surface of the heatsink and is held in place under force, with an amount of thermal grease or a phase change material between. Alternatively, the bottom surface of the metal baseplate can be soldered directly to the heatsink.

In any of these three cases, the attachment of the metal surface that has the cavities can be performed under reduced pressure (less than atmospheric pressure) so that air in various parts of the assembly is extracted.

The notion of a metal member having a planar surface with cavities as described above is not limited to use in power semiconductor device modules, but rather is generally usable where a metal member is to be joined to another metal member with good thermal transfer between the two members.

Further details, embodiments, techniques and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first object is referred to as being disposed "over" or "on" or "onto" a second object, it is to be understood that the first object can be directly on the second object, or an intervening object may be present between the first and second objects. Similarly, terms such as "upper", "top", "up", "down", "downward", "upward", "vertically", "horizontally", "laterally", "lower", "under", "below" and "bottom" are used herein to describe relative orientations between different parts of the structure being described, and it is to be understood that the overall structure being described can actually be oriented in any way in three-dimensional space.

Figure 1:
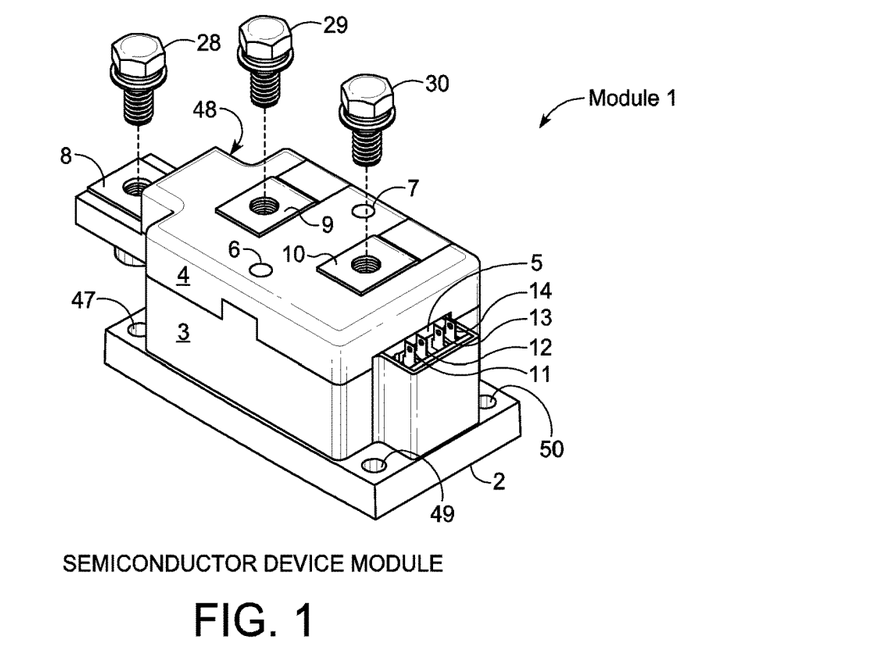
FIG. 1 is a top-down perspective diagram of a power semiconductor device module 1 in accordance with one novel aspect.

FIG. 1 is a top-down perspective diagram of a power semiconductor device module 1 in accordance with one novel aspect.

Figure 2:
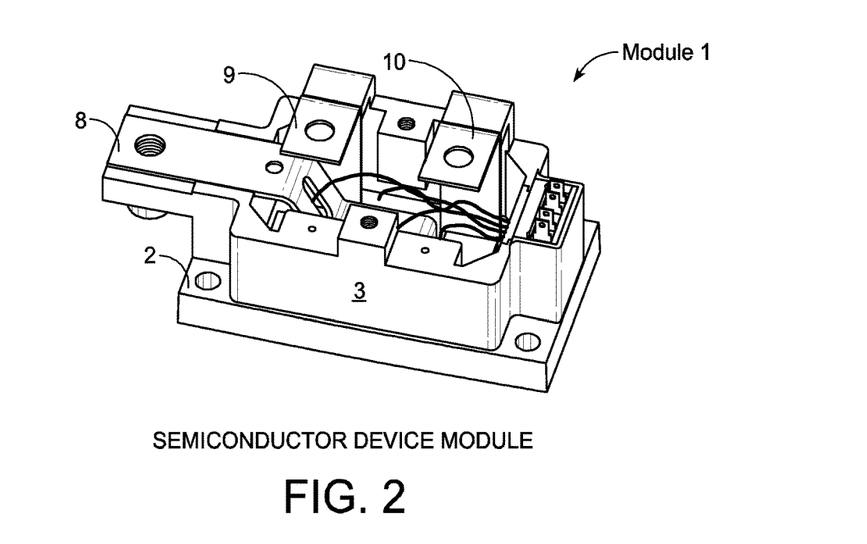
FIG. 2 is a top-down perspective diagram of module 1, but with its top housing portions 4 and 5 removed.

FIG. 2 is a top-down perspective diagram of module 1, but with its top housing portions 4 and 5 removed.

Figure 3A:
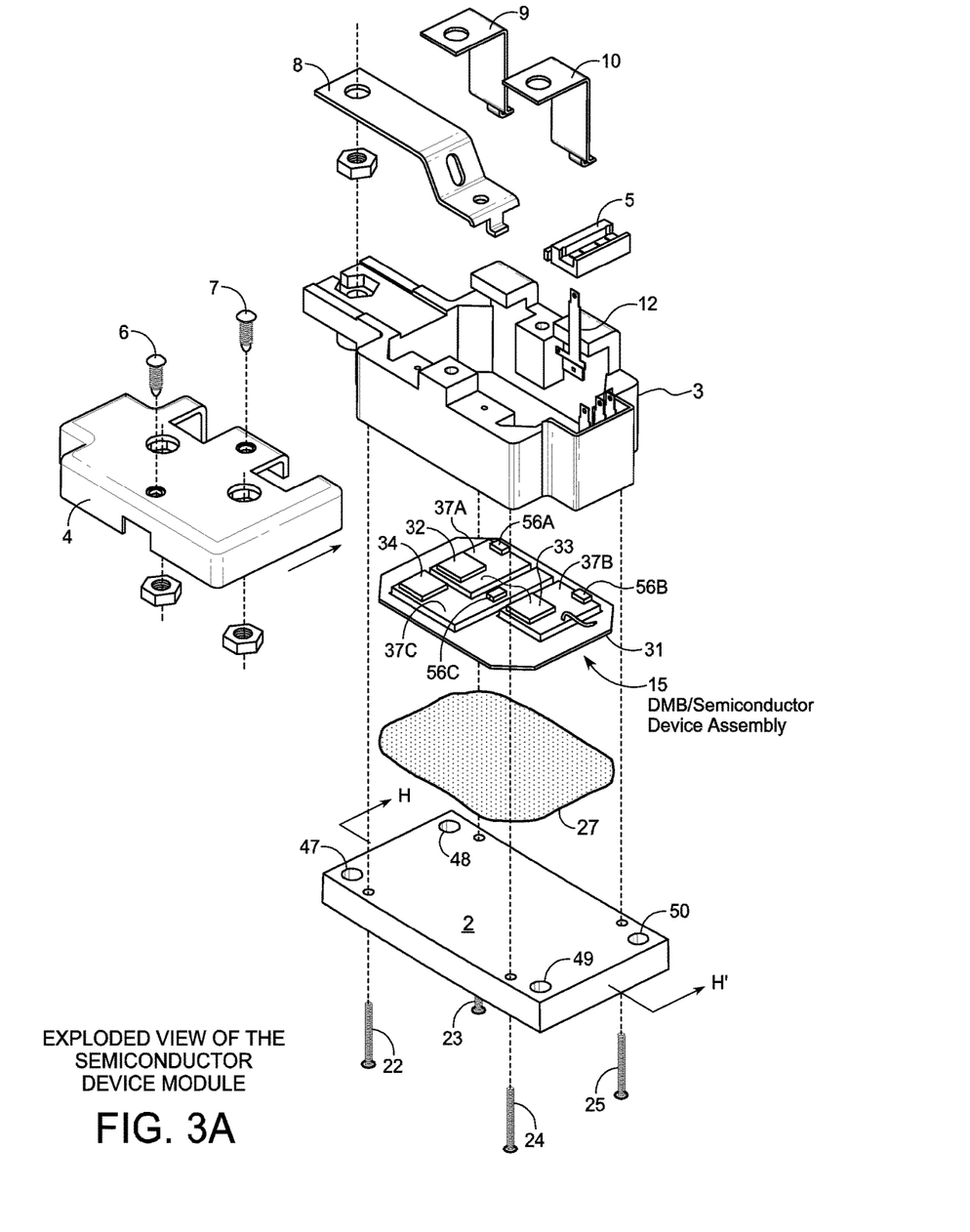
FIG. 3A is an exploded view of module 1, seen in perspective.

FIG. 3A is an exploded view of module 1, seen in perspective.

Figure 3B:
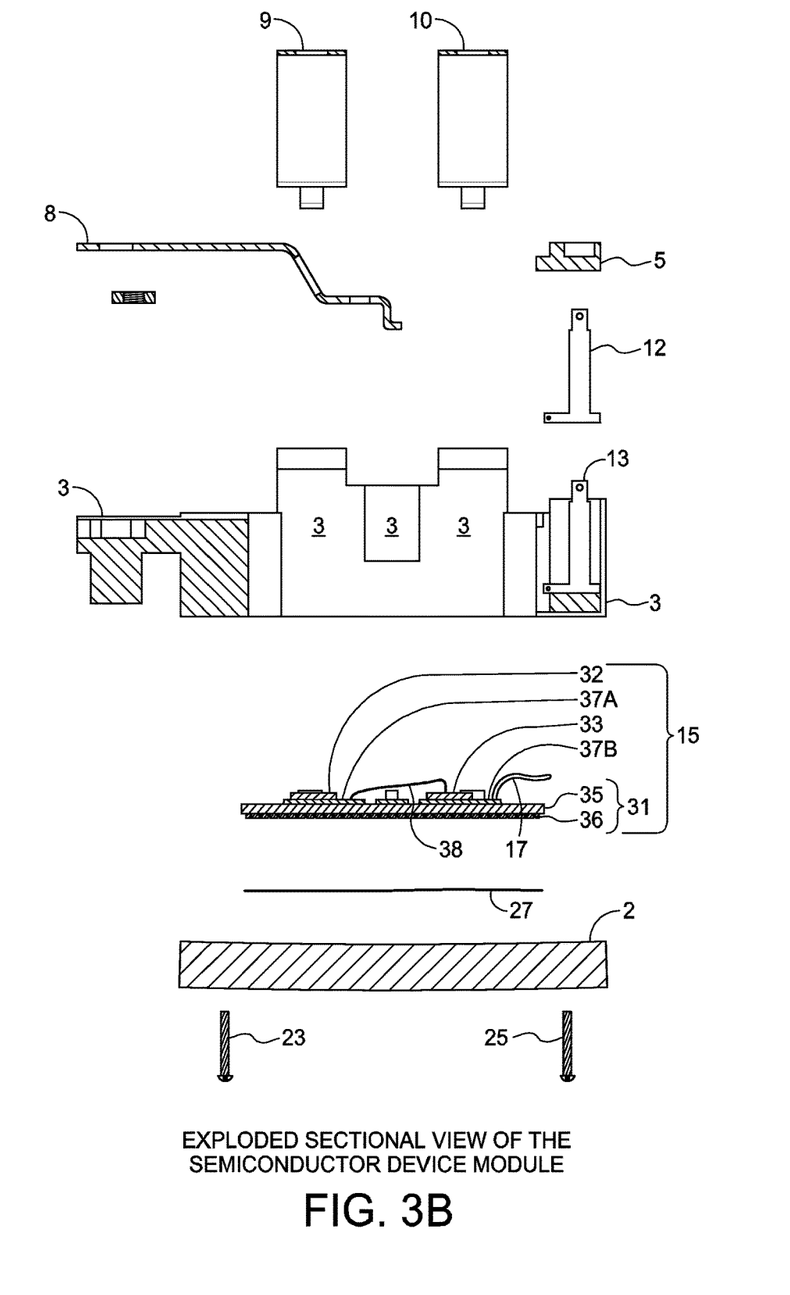
FIG. 3B is an exploded view of module 1, seen in cross-section.

FIG. 3B is an exploded view of module 1, seen from the side in cross-section. The cross-sections of FIG. 3B are taken along sectional line H-H' of FIG. 3A.

Figure 4:
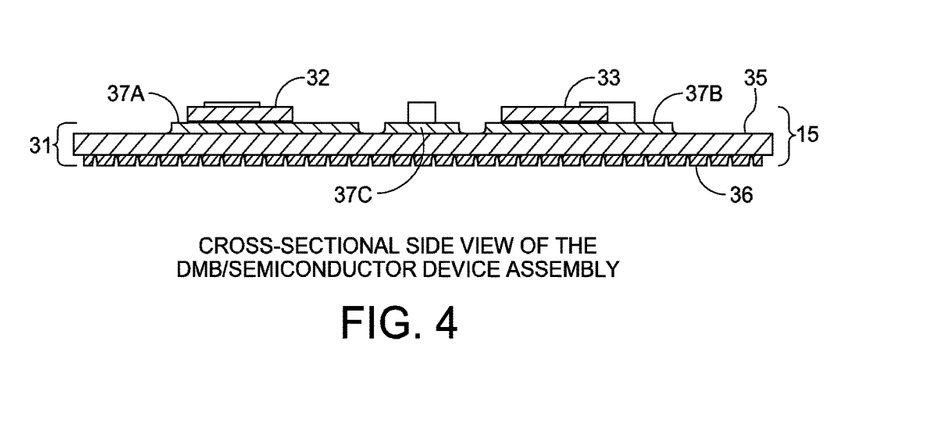
FIG. 4 is a cross-sectional side view of the DMB/semiconductor device assembly 15 within module 1.

FIG. 4 is a cross-sectional side view of the DMB/semiconductor device assembly 15 within module 1.

Figure 5:
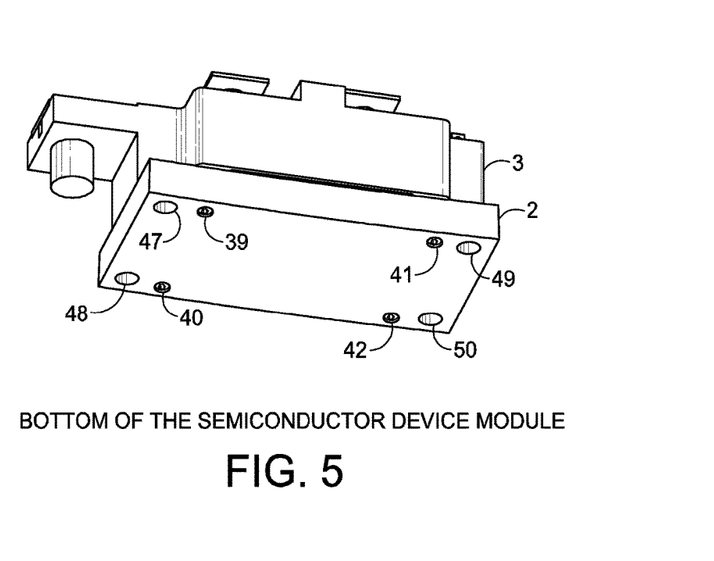
FIG. 5 is a perspective diagram of the bottom of module 1.

FIG. 5 is a perspective diagram of the bottom of module 1.

Figure 6:
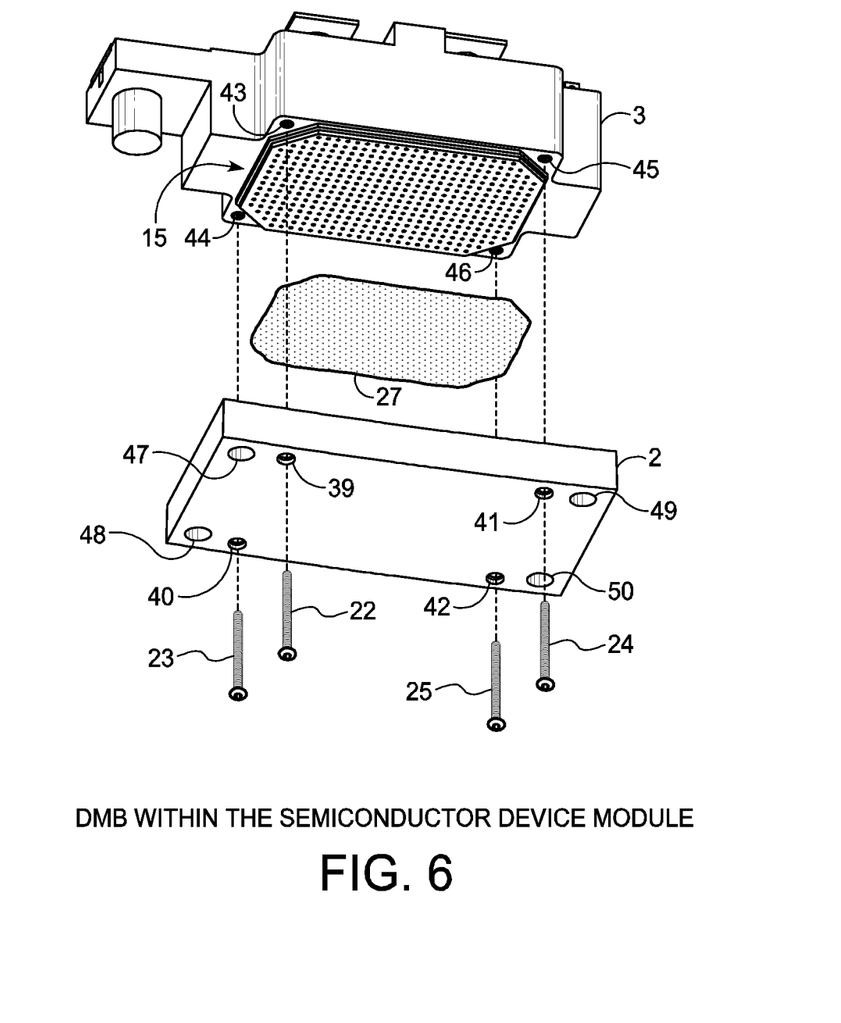
FIG. 6 is an exploded perspective diagram of the bottom of module 1, but with housing portions 4 and 5 removed.

FIG. 6 is an exploded perspective diagram of the bottom of module 1, so that the bottom surface of the bottom metal plate 36 of the DMB/semiconductor device assembly 15 can be seen. The housing portions 4 and 5 of the overall module housing are not present in the diagram.

The module 1 includes a metal baseplate 2, an injection molded insulative plastic housing involving three portions 3, 4, and 5, two press-fit pins 6 and 7, three large external connection terminals 8-10, four smaller external connection terminals 11-14, a DMB/semiconductor device assembly 15, wires that connect the DMB/semiconductor device assembly to the three large external terminals (one of these wires 17 is illustrated), four screws 22-25 that hold the baseplate to the housing, an amount of soft silicone gel (not illustrated), an amount of epoxy encapsulant (not illustrated), and an amount of thermal grease 27. Three bolts 28-30 extend through corresponding holes in the three large external connection terminals 8-10 and engage threads on three corresponding nuts. (Although in the particular example module shown, the four screws 22-25 extend in from the bottom of the baseplate, in other example modules the screws extend in the other direction from housing portion 3, and through housing portion 3, and thread into threaded holes in the baseplate.)

The DMB/semiconductor device assembly 15 includes a DMB structure 31 and plurality of bare semiconductor device dice 32-34. In the present example, each of the bare semiconductor device dice is a separate discrete power semiconductor device die such as a discrete power transistor (IGBT or power MOSFET), a discrete power diode, or a discrete power thyristor. A bare semiconductor die can also involve a combination of these discrete devices. The dice are soldered to the top plates 37A, 37B and 37C of the DMB structure. In addition to these bare semiconductor device dice, the DMB/semiconductor device assembly 15 can also include one or more other components such as a resistor, a capacitor, or an inductor.

The DMB structure 31 of the DMB/semiconductor device assembly 15 can either be a DCB (Direct Copper Bonded) substrate or a DAB (Direct Aluminum Bonded) substrate. In either case, the DMB structure 31 is a multi-layer structure that includes an insulative but thermally conductive center ceramic substrate layer 35, a planar bottom direct metal bonded metal layer 36 that is bonded to the bottom surface of the ceramic substrate layer, and a planar top direct metal bonded metal layer 37 that is bonded to the top surface of the ceramic substrate layer. The ceramic substrate layer 35 may be, for example, alumina ($Al_2O_3$) or aluminum nitride (AlN). The top metal layer 37 is patterned into the plurality of islands 37A, 37B and 37C of metal. Each of the metal islands 37A-37C and the bottom metal layer 36 is also referred to as a "plate". For additional details and information on DMB structures, and how to make a DMB structure such as DMB structure 31, see: U.S. Pat. Nos. 6,404,065, 6,798,060, 7,005,734, and 9,111,782 (the entire subject matter of each of these four patent documents is incorporated herein by reference). The dice 32-34 are surface mount soldered to the islands 37A-37C of the top metal layer 37 of DMB structure 31. The various discrete semiconductor device dice and various islands of the DMB structure 31 are electrically interconnected by heavy aluminum bonding wires or clips. One of these wires, wire 38, is illustrated. Other heavy wires provide electrical connections between the DMB structure 31 and the external connection terminals 11-14 of the module. One of these wires, wire 17, is illustrated. In the case of the DMB being a DCB, the top and bottom metal layers 37 and 36 are copper or a multi-layer structure involving copper. In the case of the DMB being a DAB, the top and bottom metal layers 37 and 36 are aluminum or a multi-layer metal structure involving aluminum. In the example illustrated here, the DMB structure 31 is a DCB.

As shown in FIG. 6, the DMB/semiconductor device assembly 15 is glued to the bottom of the housing portion 3. After wires (bonding wires and wires that couple to external terminals) are provided, the soft silicone gel (not shown) is placed over the electronics in the housing so that the wires and dice are covered. The silicone gel is allowed to cure. An amount of epoxy encapsulant (cured also, not shown) is placed over the silicone gel so that the bottom of the central cavity of the first housing portion 3 is substantially filled. On the bottom of the DMB/semiconductor device assembly 15, the amount of thermal grease 27 is applied. The metal baseplate 2 is pressed up against the bottom of the DMB/semiconductor device assembly 15. The four screws 22-25 are then threaded into engaging threaded holes 39-42 in the baseplate 2, and thread farther up into threaded holes 43-46 in the housing portion 3. When the screws 22-25 are tightened, the metal baseplate 2 and the housing portion 3 are drawn together, thereby forcing the top surface of the metal baseplate 2 into good thermal contact with the bottom surface of the bottom plate 36 of the DMB/semiconductor device assembly 15. The thermal grease 27 is pressed between the bottom metal plate 36 of the DMB structure 31 and the top of the metal baseplate 2.

As shown in FIG. 1, the metal baseplate 2 has four mounting holes 47-50. Four corresponding bolts (not shown) are fitted into these four holes 47-50 and are torqued down in order to attach the bottom of the metal baseplate 2 to the top of a heatsink (not shown). Another amount of thermal grease or a phase change material (not shown) is disposed between the bottom of the metal baseplate 2 and the top of the heatsink (not shown) so that there is good thermal contact between baseplate 2 and the heatsink (not shown).

Figure 7:
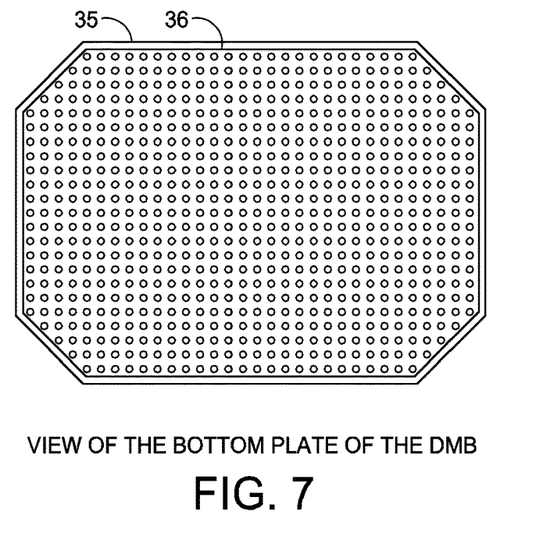
FIG. 7 is a diagram of the bottom of the DMB structure of module 1.

FIG. 7 is a diagram of the bottom of the DMB structure. Both the bottom metal plate 36 and the ceramic layer 35 are both octagonally shaped as illustrated, but the bottom metal plate 36 is slightly smaller than the ceramic layer 35. Each small dot of the two-dimensional array of small dots in the illustration represents one cavity. Each of the cavities extends into the bottom metal plate 36 from the plane of the bottom surface 51 of the bottom metal plate 36.

Figure 8:
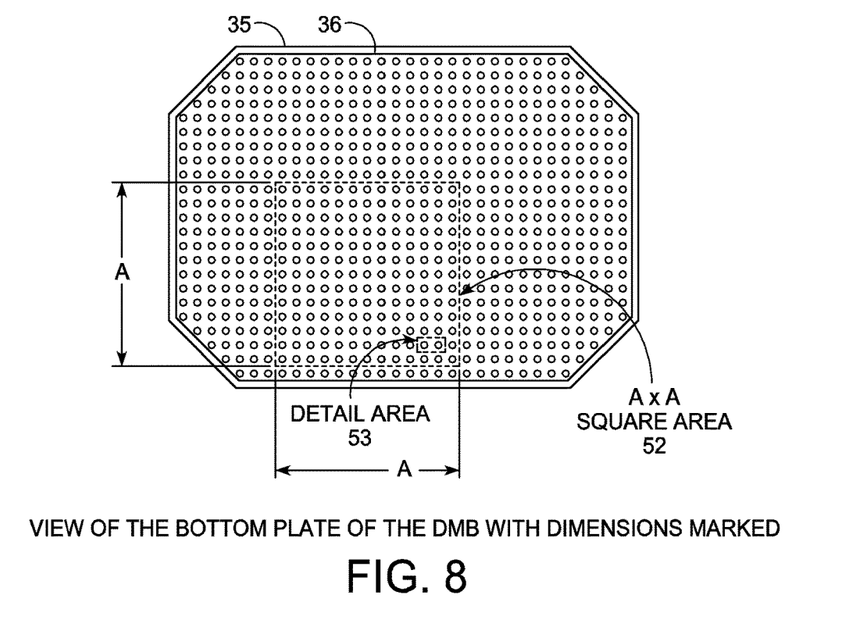
FIG. 8 is a diagram like that of FIG. 7, except that an "A by A square area" 52 of the bottom metal plate 36 is indicated by the dashed square line.

FIG. 8 is a diagram like the diagram of FIG. 7, except that an "A by A square area" 52 of the bottom metal plate 36 is indicated by the dashed square line. The "A by A square area" 52 has four sides of equal length A. In addition to this "A by A square area" 52, a detail area 53 is also indicated. There are two cavities 54 and 55 in this detail area 53. Other than for the cavities illustrated in FIG. 8 on the bottom surface of the bottom metal plate 36, the entire remainder of the bottom surface of the bottom metal plate 36 is substantially planar.

Figure 9:
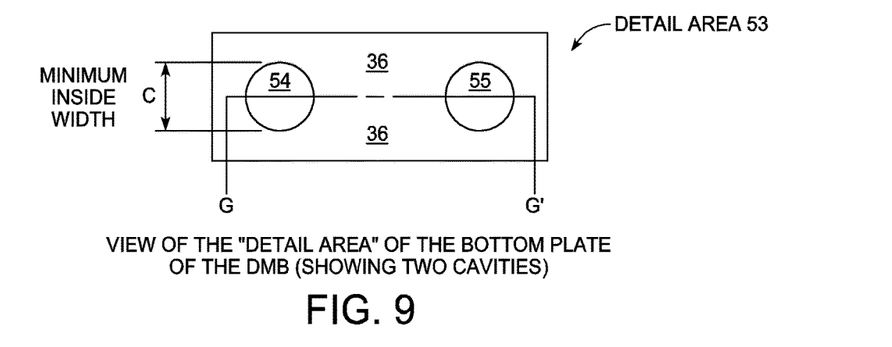
FIG. 9 is an expanded view of the detail area 53 of FIG. 8.

FIG. 9 is an expanded view of the detail area 53 of FIG. 8. When viewed from the perspective of looking at the DMB structure 31 straight on as in the view of FIG. 8, each cavity has a circular shape. The circle is of a diameter of C. Diameter C is also the minimum inside width of each of the individual cavities in the "A by A square area" 53.

Figure 10:
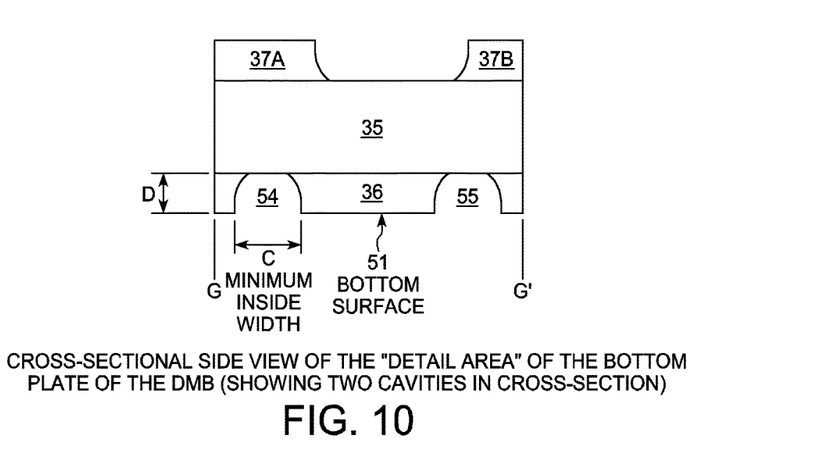
FIG. 10 is an expanded cross-sectional side view of the detail area 53 of FIG. 9.

FIG. 10 is an expanded view of the detail area 53 of FIG. 8, but in the case of FIG. 10 the view is a cross-sectional side view taken along sectional line G-G' of FIG. 9. Each of the cavities 54 and 55 is of the same depth, and this depth does not exceed dimension D. The number and size of the cavities in the "A by A square area" 52 is such that the aggregate cavity volume is in a range between a bottom range value of E and a top range value of F. In the present example, the 0.30 millimeter thickness of the bottom metal plate 36 is the same as the thickness of the top metal plate 37. The center ceramic layer 35 is alumina and is 0.63 millimeters thick. The two plates 36 and 37 are both patterned with a protective photoresist, and are then simultaneously etched. After etching, the photoresist is stripped. In one example, the two plates 36 and 37 are etched by placing the DMB structure 31 into a wet etching solution, so the islands 37A-37C are formed out of the top metal plate 37 at the same time that the bottom metal plate 36 and the two-dimensional array of cavities is formed. Because both the top plate and the bottom plate of the unpatterned DMB are etched at the same time, there is very little if any additional cost to providing the novel cavities in the bottom metal plate 36 as compared to a prior art method of making the DMB structure with no cavities.

Figure 11:
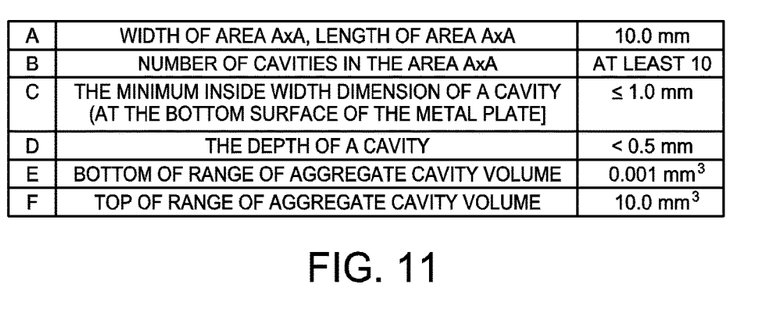
FIG. 11 is a table that sets forth dimensions and parameters for module 1.

FIG. 11 is a table that sets forth dimensions and parameters A-F. The diagrams of FIGS. 7-10 are not necessarily to scale, and are not necessarily accurate in terms of the number and size of the cavities, but rather are provided for illustrative purposes. The dimensions and parameters A-F set forth in FIG. 11 are controlling. The values B-D are selected to cover a determined range of realistic and workable cavities and cavity distributions, for a range of realistic and workable bottom metal plate thicknesses. In a preferred embodiment, for thermal conduction reasons, the cavities should not be so deep that they reach the central ceramic sheet member portion of the DMB. The parameter F was determined by considering an applied typical thickness of thermal grease of about 50-60 micrometers, where this thickness of thermal grease as initially applied covers the A by A square area. Not all of this thermal grease is then later to be consumed into the aggregate cavity volume as the module operates, so the maximum aggregate cavity volume is determined accordingly. The parameter F was set to be somewhat above this aggregate value. The parameter E was determined by considering the minimum number of cavities B for the range of realistic examples, and the minimum volume of each cavity for the range of realistic examples, and by multiplying the two numbers to obtain a product, and then selecting the parameter E to be slightly below the product. The structures defined by the parameters A-F are not to include or to encompass some metal surface that just incidentally happens to have a cavity or cavities, but that otherwise has nothing to do with DMB substrates for carrying power semiconductor devices. Parameters A-F are selected to exclude such incidental structures.

When the DMB structure 31 is attached and pressed to the metal baseplate 2 as explained above, some of the thermal grease will be forced up into the cavities. Some air that was in the cavity may remain in the cavity but may be somewhat compressed. As a result of the attachment of the metal baseplate 2, there can be a smaller final distance between the metal of the bottom metal plate 36 and the metal of the top surface of the metal baseplate 2. The top surface of the metal baseplate 2 may not be perfectly flat. Likewise, the bottom surface of bottom metal plate 36 may be somewhat irregular, especially when the upper part of the module is forced against the metal baseplate 2 with substantial force. Accordingly, there may be areas of relatively good metal-to-metal contact, and other areas of more separation between the metal of the bottom metal plate 36 and the metal of the top of the metal baseplate 2. The average overall separation, however, is smaller as compared to a module in which the bottom surface of the DMB is planar and has no cavities.

The cavities in the bottom metal plate 36 can be thought of as working much in the same way as the grooves in a car tire. A car tire has grooves. As the tire is pressed against water-covered pavement, some of the water is forced out from under the tire and up into the grooves. This results in less water being disposed under the tire between the tire and pavement. This increases the amount of rubber that is actually in contact with the pavement as the tire rolls over the pavement. In somewhat the same way, in the example of the cavities in the bottom metal plate 36, some of the thermal grease is forced up into the cavities as the DMB structure 31 and the metal baseplate 2 are pulled together (under the force of the four screws 22-25). This increases the amount of metal of the bottom metal plate 36 that is actually in contact with metal of the top of the metal baseplate 2.

In addition, there is slightly more metal surface area on the bottom of the bottom metal plate 36 as compared to the same DMB structure if it were to have no cavities. In some small sense, the bottom of the bottom metal plate 36 is slightly finned. In this sense, the cavities in the bottom metal plate 36 can be thought of as working like the fins on a heatsink. Fins are commonly added to a heatsink in order to increase thermal transfer (to reduce thermal resistance) between the higher temperature heatsink material and a lower temperature fluid medium (such as air) into which the heat is to be discharged. In somewhat the same way, in the example of the cavities in the bottom metal plate 36, the metal of the bottom metal plate 36 can be thought of as the finned heatsink and the thermal grease can be thought of as the lower temperature medium into which heat from the heatsink is to be discharged. Thermal transfer from the DMB structure to the thermal grease may be improved by making the bottom of the metal base plate 36 more finned and by increasing the surface area of the bottom surface of the metal base plate 36.

The bottom surface that is referred to above as being slightly finned either has, or is believed to have, the following two advantages. First, by the consumption of thermal grease the fin-like structures work like short circuit paths for heat flow. The copper structures serve as thermal bridges through an insulating layer, because the thermal grease or phase change material or solder are, from a thermal management point of view, relatively insulating layers compared to the higher thermal conductivity of copper. Second, the thermal grease or phase change material has a tendency to dry out at higher temperatures (>100 degrees Celsius). If this layer were to dry out, then thermal conductivity between the finned surface and the underlying heat-absorbing surface would degrade. The cavities store an amount of thermal grease or phase change material, and this has the effect of slowing down the dry out process.

In a second embodiment, there is a phase change material (PCM) between the DMB structure 31 and baseplate 2 as opposed to thermal grease. This PCM material may be applied as a paste, at room temperature, to the bottom surface of the bottom metal plate 36. The PCM paste may be applied in a pattern so that it covers some parts of the bottom surface of the DMB structure 31 but does not cover others. After being applied as a paste at room temperature, the PCM paste is cured under an elevated temperature so that the PCM develops a rubber-like composition. The upper part of the module housing, with the DMB structure 31 having its layer of cured PCM, is then attached to the metal baseplate 2 as explained above. The four screws 22-25 are tightened to hold the metal baseplate 2 in place, and to keep the metal baseplate 2 pressing against the bottom of the DMB structure 31 with a desired pressure. When the module 1 is then used in an electronic circuit or application, the electronic components mounted to the top of the DMB operate and generate heat. This heat causes the temperature of the DMB substrate 31 to increase. At about 45 to 60 degrees Celsius, the PCM undergoes a phase change and becomes a lower-viscosity, cream-like material. This material wets the interface between metal plate 36 and baseplate 2. Some of the PCM flows up into the cavities as explained above, and this improves the thermal transfer between the DMB structure 31 and the metal baseplate 2 as explained above.

Figure 12:
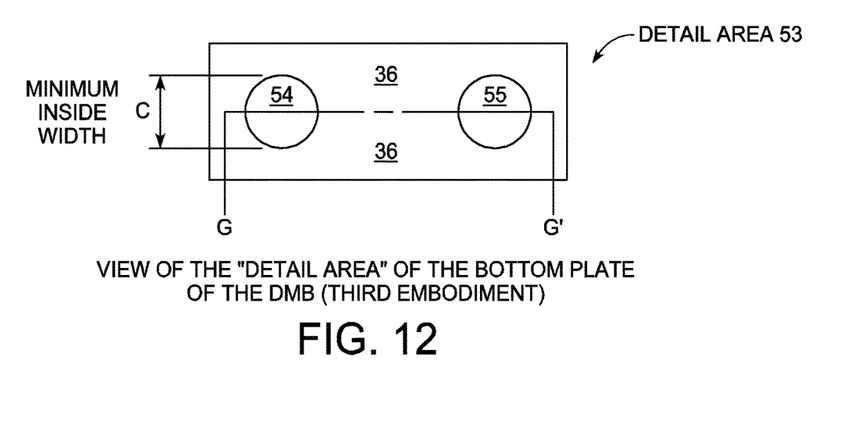
FIG. 12 is a view of the detail area 53 of FIG. 8, but in a third embodiment in which the cavities do not extend all the way through the bottom metal plate.

FIG. 12 is a view of the detail area 53 of FIG. 8, but in a third embodiment in which the cavities do not extend all the way through the bottom metal plate 36.

Figure 13:
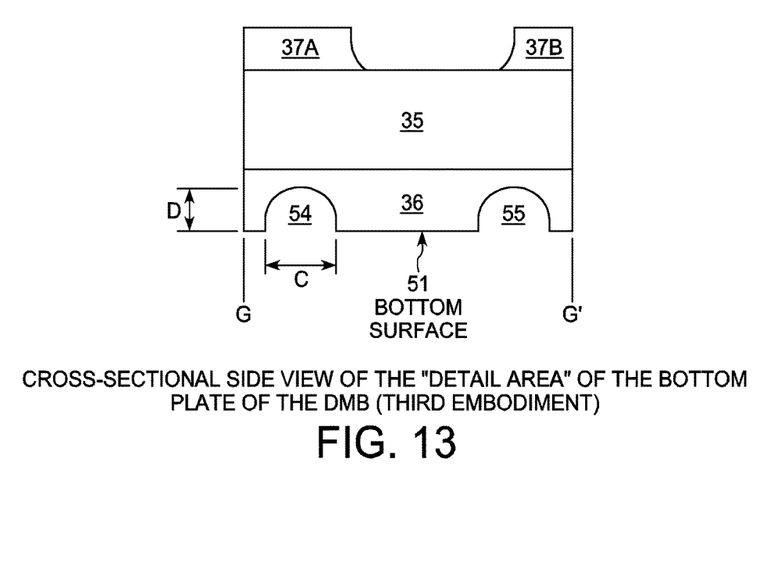
FIG. 13 is a cross-sectional side view of the detail area 53 of FIG. 12.

FIG. 13 is a cross-sectional side view of the detail area 53 of FIG. 12.

Figure 14:
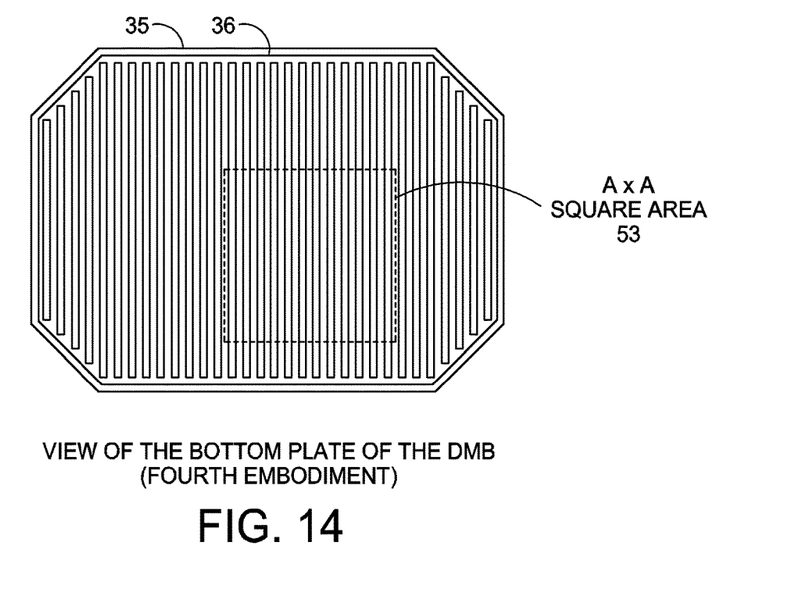
FIG. 14 is a diagram of the bottom of the DMB structure in accordance with a fourth embodiment.

FIG. 14 is a diagram of the bottom of the DMB structure in accordance with a fourth embodiment. In this embodiment, the cavities are not circular from the top-down perspective but rather are elongated strip-like trench structures. Even though the strip-like cavities have an elongated dimension, they still have the same minimum inside width C as do the cavities of FIG. 7. The strip-like trench cavities can appear as FIG. 10 in cross-section, or can appear as FIG. 13 in cross-section. For purposes of counting cavities, such an elongated strip-like cavity is considered to be within the "A by A square area" if a part of it is in the area, and another part is outside.

Although a few illustrative examples of cavity shapes are set forth in the description above, it is to be understood that there are many different cavity shapes that can be imagined. For example, the following layout of cavities can satisfy the requirements of FIG. 11: a pattern of first narrow trenches that extend parallel to one another in a first direction, with a pattern of second narrow trenches that extend parallel to one another in a second direction, where the first and second directions are perpendicular to one another, and where the first and second narrow trenches cross each other in a grid-like pattern. In another example, a matrix of a plurality of cross-shaped trenches can satisfy the requirements of FIG. 11. A DMB structure having any of these different cavity shapes is encompassed within the novel aspect disclosed in this patent document provided that the requirements set forth in the table of FIG. 12 are satisfied.

Although the DMB structure 31 having the cavities is described above with either thermal grease or a phase change material, the DMB structure 31 with the cavities can also be soldered to another structure. For example, the DMB structure 31 can be soldered to the metal baseplate 2. In one example, solder paste is placed between the DMB structure 31 and the metal baseplate 2. In another example, solder foil is placed between the DMB structure 31 and the metal baseplate 2. The stack structure is then heated in a vacuum oven to about 350 degrees Celsius such that the solder becomes liquid. A partial vacuum (pressure below atmospheric pressure) is then applied to the oven, and this causes air to be removed from the oven and the structure being soldered. Some of all of the air in the cavities may, for example, be removed due to the use of this partial vacuum. The stack is then allowed to cool so that the solder solidifies. After this process, dice can be soldered to the top of the DMB structure. Alternatively, the dice can be soldered to the top of the DMB structure in the vacuum oven heating step. Wire bonding is then performed to connect dice and/or islands together on the top of the DMB structure as desired. Next, a first plastic module housing portion is placed down over the DMB structure. This first plastic module housing portion may be glued to the metal baseplate. Large external connection terminals are then slid down into accommodating grooves in the first plastic module housing portion. Wires are attached to couple the electronic components and the islands on the top of the DMB structure to the smaller pin-like external connection terminals. An amount of the silicone gel is poured over the electronics in the module housing. After the silicone gel has cured, then the second and third plastic module housing portions 4 and 5 are attached. The plastic module housing portion 4 may be glued to the first plastic module housing portion 3. After being glued, it may also be held in place by pins 6 and 7. Accordingly, rather than thermal grease or a phase change material being in contact with the bottom surface of the DMB structure having the cavities, in some applications solder is in contact with the bottom surface of the DMB structure having the cavities. This solder can either attach the DMB structure to another part of the module, or the solder can attach the module to another object such as a heatsink, or a part of the printed circuit board.

Figure 15:
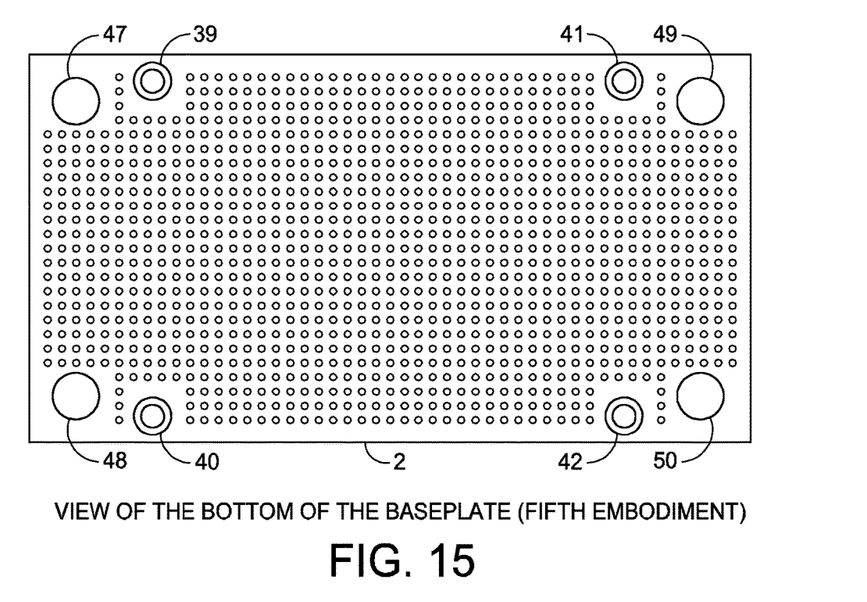
FIG. 15 is a diagram of the bottom of the DMB structure of module 1 in accordance with a fifth embodiment.

FIG. 15 is a perspective view of the bottom of the metal baseplate in accordance with a fifth embodiment. In this embodiment, the metal sheet that has the novel cavities is not the bottom metal sheet of the DMB structure, but rather is the bottom of the metal baseplate 2. The bottom surface of the metal baseplate 2 is provided with a two-dimension matrix of the cavities so that the requirements of the table of FIG. 12 are satisfied. More generally, the metal surface of any semiconductor package that is to contact a flat metal heatsink surface when the semiconductor package is mounted can be made to have cavities as described above. The cavities described above can be provided on semiconductor device packages other than power semiconductor device modules.

Although certain specific embodiments are described above for instructional purposes, the teachings of this patent document have general applicability and are not limited to the specific embodiments described above. Although examples are set forth above in which the distribution of cavities across a planar metal surface is uniform, the distribution of cavities across a planar metal surface need not be uniform but rather can vary and can be non-uniform. Also, the shape of the cavities in a surface need not all be the same. Some cavities may be of one shape, whereas other cavities may be of another shape. The depth of the various cavities in a surface need not all be the same. Some cavities can be deeper than others. Accordingly, various modifications, adaptations, and combinations of various features of the described embodiments can be practiced without departing from the scope of the invention as set forth in the claims.

What is claimed is:

1. A power semiconductor device module comprising:
   a semiconductor device die; and
   a Direct Metal Bonded (DMB) substrate comprising:
      an insulative ceramic sheet member;
      a top metal plate that is directly bonded to a top surface of the insulative ceramic sheet member, wherein the semiconductor device die is attached to the top metal plate; and
      a bottom metal plate that is directly bonded to a bottom surface of the insulative ceramic sheet member; and
   a metal baseplate having a substantially planar metal surface, wherein the substantially planar metal surface forms an outside surface of the power semiconductor device module, wherein the metal baseplate has a plurality of cavities each of which extends into the metal baseplate from the substantially planar metal surface, wherein the metal baseplate is in thermal contact with the bottom metal plate, wherein an A by A square area of the metal baseplate includes at least a part of each of B of the cavities, wherein each of the B cavities of the A by A square area has a minimum inside width dimension that is not more than C millimeters across, wherein each of the B cavities has a depth that is less than D millimeters, and wherein the A by A square area of the metal baseplate has an aggregate cavity volume of between E cubic millimeters and F cubic millimeters;
   wherein A is 10.0 millimeters, wherein B is ten, wherein C is 1.0 millimeters, wherein D is 0.5 millimeters, wherein E is 0.001 cubic millimeters, and wherein F is 10.0 cubic millimeters.

2. The power semiconductor device module of claim 1, further comprising:
   an insulative housing;
   wherein the bottom metal plate of the DMB and the metal baseplate are disposed so that an amount of thermal grease is in contact with both a top planar surface of the metal baseplate and the bottom surface of the bottom metal plate.

3. The power semiconductor device module of claim 1, further comprising:
   an insulative housing;
   wherein the bottom metal plate of the DMB and the metal baseplate are disposed so that an amount of a phase change material is in contact with both a top planar surface of the metal baseplate and the bottom surface of the bottom metal plate.

4. The power semiconductor device module of claim 1, further comprising:
   an insulative housing;
   wherein the bottom metal plate of the DMB and the metal baseplate are disposed so that an amount of solder is in contact with both a top planar surface of the metal baseplate and the bottom surface of the bottom metal plate.

5. The power semiconductor device module of claim 1, wherein each of the B cavities is a circular recess into the substantially planar metal surface.

6. The power semiconductor device module of claim 1, wherein each of the B cavities is an elongated strip-like trench in the substantially planar metal surface.

* * * * *